(12) United States Patent
Hatsukawa et al.

(10) Patent No.: US 8,536,930 B2
(45) Date of Patent: Sep. 17, 2013

(54) SWITCHING CIRCUIT

(75) Inventors: Satoshi Hatsukawa, Osaka (JP); Nobuo Shiga, Osaka (JP); Kazuhiro Fujikawa, Osaka (JP); Takashi Ohira, Toyohashi (JP); Kazuyuki Wada, Toyohashi (JP); Tuya Wuren, Toyohashi (JP); Kazuya Ishioka, Iwaki (JP); Hiroshi Ishioka, legal representative, Iwaki (JP); Kazushi Sawada, Toyohashi (JP)

(73) Assignees: Sumitomo Electric Industries, Ltd., Osaka-shi (JP); National University Corporation Toyohashi University of Technology, Toyohashi-shi (JP)

( * ) Notice: Subject to any disclaimer, the term of this patent is extended or adjusted under 35 U.S.C. 154(b) by 0 days.

(21) Appl. No.: 13/535,001

(22) Filed: Jun. 27, 2012

(65) Prior Publication Data

US 2012/0326774 A1 Dec. 27, 2012

Related U.S. Application Data

(60) Provisional application No. 61/501,504, filed on Jun. 27, 2011.

(30) Foreign Application Priority Data

Jun. 27, 2011 (JP) .................................. 2011-141988

(51) Int. Cl.
*H03K 17/687* (2006.01)
(52) U.S. Cl.
USPC .............................. 327/427; 326/83; 327/108

(58) Field of Classification Search
USPC ........... 327/108–112, 419, 427, 434; 326/82, 326/83
See application file for complete search history.

(56) References Cited

U.S. PATENT DOCUMENTS

| 7,245,088 | B2 * | 7/2007 | Huang et al. ................... | 315/291 |
| 7,961,023 | B2 * | 6/2011 | Gizara ............................ | 327/175 |
| 2012/0249189 | A1 * | 10/2012 | Frattini et al. ................. | 327/109 |
| 2012/0306563 | A1 * | 12/2012 | Fujikawa et al. .............. | 327/434 |

FOREIGN PATENT DOCUMENTS

| JP | 61-039621 A | 2/1986 |
| JP | 09-266421 A | 10/1997 |
| JP | 2006-101637 A | 4/2006 |
| JP | 2011-055152 A | 3/2011 |

* cited by examiner

*Primary Examiner* — William Hernandez
(74) *Attorney, Agent, or Firm* — Venable LLP; Michael A. Sartori

(57) ABSTRACT

A switching circuit according to one embodiment includes: a switching element that has a first terminal and a second terminal, and is driven by a pulse signal to switch a conduction state between the first and second terminals; a power source section that supplies a voltage to the first terminal; a load circuit that is connected in parallel with the power source section; a passive circuit section that is connected between a connection point between the power source section and the load circuit, and the first terminal, and suppresses a current flowing from the connection point to the switching element at a frequency N times (N is an integer of 1 or more) as high as a clock frequency of the pulse signal; and a resonant circuit section that is connected between the passive circuit section and the connection point, and resonates at the frequency of N times.

8 Claims, 15 Drawing Sheets

| N\n | 1 | 2 | 3 | 4 | 5 | 6 | 7 | 8 | 9 | 10 | 11 | 12 | 13 | 14 | 15 | 16 | 17 | 18 | ... |
|---|---|---|---|---|---|---|---|---|---|---|---|---|---|---|---|---|---|---|---|
| 1 | O |   | O |   | O |   | O |   | O |   | O |   | O |   | O |   | O |   |   |
| 2 |   | O |   |   |   | O |   |   |   | O |   |   |   | O |   |   |   | O |   |
| 3 |   |   |   | O |   |   |   |   |   |   |   | O |   |   |   |   |   |   |   |
| 4 |   |   |   |   |   |   |   | O |   |   |   |   |   |   |   |   |   |   |   |
| ... |   |   |   |   |   |   |   |   |   |   |   |   |   |   |   |   |   |   |   |

SWITCHING CIRCUIT

CROSS-REFERENCE TO RELATED APPLICATIONS

This application claims priority to Provisional Application Ser. No. 61/501,504, filed on Jun. 27, 2011 and claims the benefit of Japanese Patent Application No. 2011-141988, filed on Jun. 27, 2011, all of which are incorporated herein by reference in their entirety.

BACKGROUND

1. Field

Embodiments of the present invention relate to a switching circuit.

2. Description of the Related Art

There are known switching circuits using switching elements such as transistors (See Japanese Patent Laid-Open No. 2006-101637). In the switching circuit disclosed in Patent Literature 1, a PWM (pulse width modulation) signal is supplied to an input terminal (e.g., a gate terminal) of the switching element. The switching element is controlled to be switched ON/OFF by a clock frequency (a switching frequency) of the PWM signal. A voltage at a connection point between an output terminal (e.g., a drain terminal) and an inductor varies by the switching ON/OFF of the switching element. As a result, driving of a load circuit whose one end is connected to the connection point can be controlled.

SUMMARY

However, an extra current may flow through the load circuit or the switching element due to a signal component that is an integer multiple of the clock frequency (the switching frequency) for switching ON/OFF the switching element in addition to a current flowing through the load circuit when the switching element is in an ON state. Thus, there is unnecessary power consumption.

It is an object of the present invention to provide a switching circuit which can improve power efficiency.

A switching circuit according to one aspect of the present invention includes: a switching element that has a first terminal and a second terminal, and is driven by a pulse signal to switch a conduction state between the first terminal and the second terminal; a power source section that supplies a voltage to the first terminal of the switching element; a load circuit that is connected in parallel with the power source section; a passive circuit section that is connected between a connection point between the power source section and the load circuit, and the first terminal of the switching element, and suppresses a current flowing from the connection point to the switching element at a frequency N times (N is an integer of 1 or more) as high as a clock frequency of the pulse signal; and a resonant circuit section that is connected between the passive circuit section and the connection point, and resonates at the frequency of N times.

In the configuration, the switching element is connected to the connection point via the passive circuit section and the resonant circuit section. Thus, the state of a voltage supplied to the connection point from the power source section can be controlled by a switching operation of the switching element. As a result, the state of a voltage applied to the load circuit connected in parallel with the power source section can be controlled. Meanwhile, the passive circuit section suppresses the current flowing from the connection point to the switching element at the frequency N times as high as the clock frequency of the pulse signal. Thus, extra energy consumption can be reduced. Furthermore, the resonant circuit section resonates at the frequency of N times. Thus, the N-time frequency component out of the voltage component applied to the load circuit is reduced, so that extra energy consumption can be reduced. As a result, power efficiency can be improved.

In one embodiment, an imaginary part of an impedance of the passive circuit section anticipated from the switching element may be zero or more, and twice or less of an absolute value of a reactance of an output parasitic capacitance of the switching element. In this case, the imaginary part of the impedance of the passive circuit section anticipated from the switching element may be zero or more, and twice or less of the absolute value of the reactance of the output parasitic capacitance of the switching element at the frequency of N times.

In the embodiment, the passive circuit section can more reliably suppress the current flowing from the connection point to the switching element at the frequency N times as high as the clock frequency of the pulse signal.

In one embodiment, a real part and an imaginary part of an impedance of the resonant circuit section anticipated from the load circuit may be smaller than an impedance of the load circuit at the clock frequency of N times.

In the embodiment, the voltage applied to the load circuit can be further reduced at the frequency of N times. As a result, extra energy consumption can be reduced.

The pulse signal may be a signal obtained by temporally modulating a duty cycle of a pulse width of the pulse signal by a signal having a lower frequency component than the clock frequency.

While the passive circuit section and the resonant circuit section act against the frequency N times as high as the clock frequency, the passive circuit section and the resonant circuit section do not substantially act against the lower frequency component than the clock frequency. Thus, the signal having the lower frequency component can easily pass through the passive circuit section and the resonant circuit section to be transmitted to the load circuit. As a result, the state of the voltage applied to the load circuit varies by the signal component.

In one embodiment, the passive circuit section may be composed of at least one reactance element, and may have a first end connected to the first terminal of the switching element and a second end connected to the connection point.

In one embodiment, the passive circuit section may be composed of at least one transmission line, and may have a first end connected to the first terminal of the switching element and a second end connected to the connection point.

In one embodiment, the resonant circuit section may have M resonant elements each having at least one reactance element connected in series. In the embodiment, at least one resonant element out of the M resonant elements may resonate at the frequency of N times. The M resonant elements may be connected in parallel.

In one embodiment, the resonant circuit section may have M (M is an integer of 1 or more) transmission lines. In the embodiment, at least one transmission line out of the M transmission lines may have an electrical length of ¼ of a wavelength corresponding to the frequency N times as high as the clock frequency.

As mentioned above, the switching circuit which can improve the power efficiency can be provided.

BRIEF DESCRIPTION OF THE DRAWINGS

FIG. 10 is a table showing that there are a plurality of harmonic orders at which one end-open stub can resonate at the same time;

DETAILED DESCRIPTION

Figure 1:
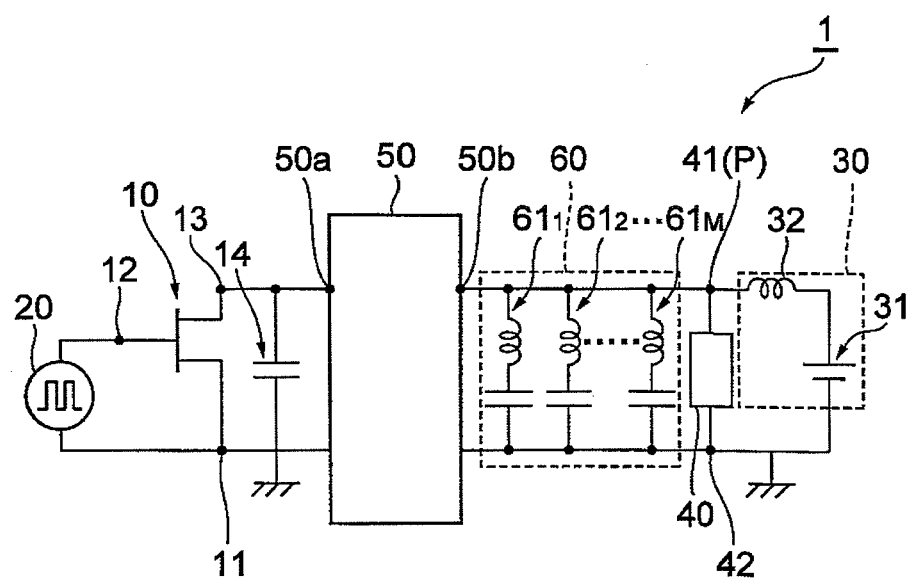
FIG. 1 is a diagram illustrating a schematic configuration of a switching circuit according to one embodiment.

In the following, embodiments of the present invention will be described by reference to the drawings. In the description of the drawings, the same elements are assigned the same reference numerals to omit the overlapping description. The dimensional ratios in the drawings do not necessarily correspond to those of the description.

Figure 2:
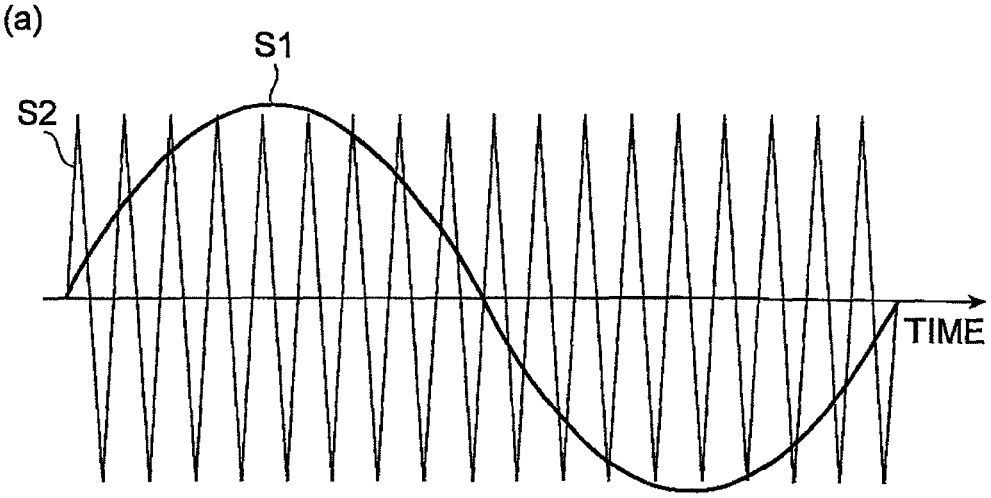
FIG. 2 is a diagram for explaining a signal that drives the switching circuit shown in FIG. 1.
Figure 2:
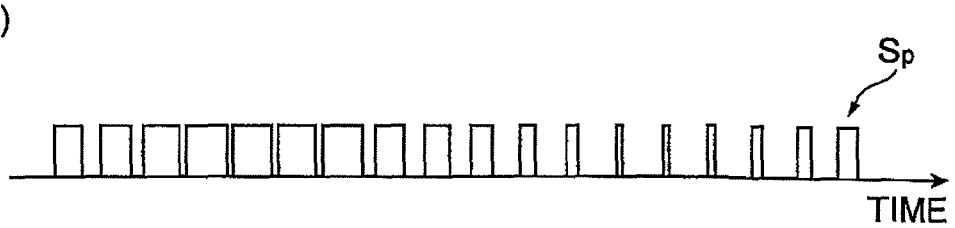

A switching circuit according to one embodiment will be described based on FIGS. 1 and 2. FIG. 1 is a circuit diagram illustrating a schematic configuration of a switching circuit 1 according to one embodiment. FIG. 2 is a diagram for explaining a signal that drives the switching circuit 1. The switching circuit 1 is a switching power source circuit or a time-varying power source circuit, for example.

The switching circuit 1 includes a switching element 10. In the present embodiment, the switching element 10 is an insulated field-effect transistor (MOSFET) unless otherwise noted. Examples of the MOSFET include a power MOSFET. In this case, the switching element 10 has a source terminal 11 to be grounded, a gate terminal 12 connected to a signal source 20 and to which a signal is supplied from the signal source 20, and a drain terminal 13 connected to a power source section 30 and to which a voltage Vdd (e.g., 16 V) is supplied. An output parasitic capacitance $C_{ds}$ exists in the switching element 10 due to its configuration. The output parasitic capacitance $C_{ds}$ includes an output parasitic capacitance between a drain and a source. In FIG. 1, the output parasitic capacitance $C_{ds}$ is shown as a capacitor 14.

The signal source 20 supplies a signal for switching the switching element 10 to the gate terminal 12. The signal inputted into the gate terminal 12 from the signal source 20 is a PWM signal $S_P$. The PWM signal $S_P$ will be described by reference to FIG. 2. FIG. 2 is a diagram for explaining the PWM signal. FIG. 2(a) shows one example of two signals for generating the PWM signal $S_P$. FIG. 2(b) shows one example of the PWM signal. The PWM signal $S_P$ is a pulse signal whose duty cycle of a pulse width is modulated by a signal (S1) having a first frequency using a signal (S2) having a second frequency higher than the first frequency. Example of the signal (S2) is triangle-wave or sawtooth-wave signal (see FIG. 2(a)). A clock frequency $f_{CK}$ of the PWM signal $S_P$, that is, a switching frequency that switches the switching element 10 corresponds to the second frequency. The other end of the signal source 20 is grounded.

Returning to FIG. 1, the configuration of the switching circuit 1 will be described. The power source section 30 is a direct-current power source section including a direct-current power source 31. The power source section 30 may include an inductor 32 in order to prevent the first frequency component of the switching element 10 from flowing into the direct-current power source 31. A positive pole of the direct-current power source 31 is connected to the drain terminal 13 via the inductor 32. A line connecting the drain terminal 13 and the direct-current power source 31 is referred to as signal path below. A negative pole of the direct-current power source 31 is grounded.

A load circuit 40 is connected in parallel with the power source section 30. Examples of the load circuit 40 include a resistive load and an inductive load. One end 41 of the load circuit 40 is connected to the positive pole of the direct-current power source 31, and the other end 42 of the load circuit 40 is grounded. As shown in FIG. 1, when the inductor 32 is provided, the one end 41 of the load circuit 40 is connected to an end of the inductor 32 on the opposite side from the direct-current power source 31. The connection point functions as an output port P.

In the above configuration, when the PWM signal $S_P$ supplied from the signal source 20 is inputted into the switching element 10, a conduction state between the drain terminal 13 and the source terminal 11 is switched by the PWM signal $S_P$. The state of a voltage at the output port P thereby varies, so that the state of a voltage applied to the load circuit 40 changes. As a result, a current flowing through the load circuit 40 varies. Accordingly, for example, when a high-frequency power amplifier is connected as the load circuit, an output amplitude of a high-frequency signal can be modulated with a large depth while high power efficiency is being maintained for the power source.

The switching circuit 1 includes a passive circuit section 50 and a resonant circuit section 60 between the switching element 10 and the output port P so as to reduce power consumption in a switching operation. The passive circuit section 50 and the resonant circuit section 60 function as a filter that cuts an N-th order harmonic of the clock frequency $f_{CK}$ of the PWM signal $S_P$ and allows a frequency lower than the clock frequency $f_{CK}$, i.e., the signal S1 having the first frequency to pass therethrough. In the following, the passive circuit section 50 and the resonant circuit section 60 will be described.

The passive circuit section 50 is arranged between the switching element 10 and the output port P. The passive circuit section 50 has a first end 50a connected to the drain terminal 13, and a second end 50b connected to the output port P. The passive circuit section 50 has a configuration that satisfies next "passive circuit section conditions" at a frequency N times as high as the clock frequency $f_{CK}$ of the pulse signal supplied to the switching element 10. In the following description, an impedance of the passive circuit section 50 anticipated from the switching element 10 (or as viewed from the switching element 10) is Z, and an imaginary part of the impedance Z is $Z_{img}$.

(Passive Circuit Section Conditions)

The imaginary part $Z_{img}$ of the impedance Z is zero or more, and twice or less of an absolute value of a reactance of the output parasitic capacitance $C_{ds}$.

When the above "passive circuit section conditions" are satisfied, a combined impedance of the output parasitic capacitance $C_{ds}$ and the passive circuit section 50 becomes large at the N-th order harmonic. As a result, the passive circuit section 50 prevents a current having the N-time clock frequency component from flowing through the switching element 10. Thus, extra power consumed in the switching element 10 in the switching operation can be reduced. As long as the passive circuit section 50 is configured to satisfy the "passive circuit section conditions", the passive circuit section 50 may be a two-port circuit network composed of at least one reactance element. The passive circuit section 50 may be also a two-port circuit network composed of at least one transmission line (including a case of a stub). Specific examples of the passive circuit section 50 will be described later.

The resonant circuit section 60 is a circuit that resonates at the frequency N times as high as the clock frequency $f_{CK}$ of the PWM signal $S_P$ as the pulse signal. As an example of a resonant state, a real part and an imaginary part of an impedance of the resonant circuit section 60 anticipated from the load circuit 40 (or as viewed from the load circuit 40) may be smaller than an impedance of the load circuit 40 at the frequency N times as high as the clock frequency $f_{CK}$.

FIG. 1 shows a circuit section obtained by connecting in parallel M resonant elements $61_1$ to $61_M$ each having an inductor and a capacitor as a reactance element connected in series as one example. One end of each of the resonant elements $61_1$ to $61_M$ is connected between the second end 50b and the output port P on the signal path connecting the output port P and the drain terminal 13. The other end of each of the resonant elements $61_1$ to $61_M$ is grounded. An element value of each of the inductor and the capacitor of at least one resonant element out of the M resonant elements $61_1$ to $61_M$ is an element value that allows resonance at the frequency N times as high as the clock frequency $f_{CK}$.

In the configuration, when the switching element 10 performs the switching operation at the frequency N times as high as the clock frequency $f_{CK}$, resonance occurs in the resonant circuit section 60. Due to the resonance, the real part and the imaginary part of the impedance of the resonant circuit section 60 become smaller than the impedance of the load circuit 40. Thus, a current flows through the resonant circuit section 60 more easily than through the load circuit 40. That is, when the switching element 10 performs the switching operation, the frequency component N times as high as the clock frequency $f_{CK}$, which the voltage applied to the load circuit 40 may have, approaches zero. Accordingly, extra energy consumption by the load circuit 40 can be reduced at the N-th order harmonic of the clock frequency $f_{CK}$.

The extra power consumption is reduced in the switching circuit 1 including the passive circuit section 50 and the resonant circuit section 60 as described above. As a result, the power efficiency can be improved.

In the following, the configurations of the passive circuit section 50 and the resonant circuit section 60 will be specifically described by reference to various embodiments.

(First Embodiment)

In the embodiment, the switching circuit 1 is sometimes referred to as switching circuit 1A. The passive circuit section 50 and the resonant circuit section 60 are referred to as passive circuit section 50A and resonant circuit section 60A, respectively. The passive circuit section 50A is a two-port circuit network composed of at least one reactance with no resistance. The resonant circuit section 60A is a parallel circuit composed of the M resonant elements $61_1$ to $61_M$ as shown in FIG. 1.

In this case, the impedance Z of the passive circuit section 50A is composed only of the imaginary part. The passive circuit section 50A is designed such that the imaginary part $Z_{img}$ of the impedance Z satisfies the above "passive circuit section conditions." That is, in the present embodiment, the passive circuit section 50A is designed such that the combined impedance of the passive circuit section 50A and the output parasitic capacitance $C_{ds}$ becomes infinity at the clock frequency $f_{CK}$. In this case, the imaginary part $Z_{img}$ of the impedance of the passive circuit section 50 is equal to the absolute value of the reactance of the output parasitic capacitance $C_{ds}$. Thus, the "passive circuit section conditions" are satisfied. In the following, the description is made by setting the reactance of the passive circuit section 50A with respect to the frequency of N times to $X_N(\omega)$ as a function of an angular frequency $\omega$. Although the passive circuit section 50A is described by exemplifying a specific numerical value for N, the same reference numerals may be assigned as the reference numerals of elements. Please note that element values of respective elements are set as numerical values corresponding to the exemplified value of N.

Figure 3:
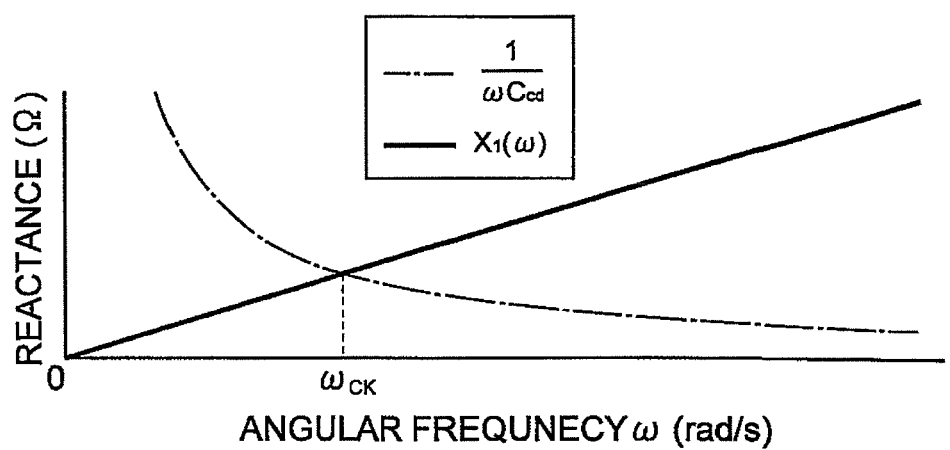
FIG. 3 is a graph showing design conditions of a passive circuit section having the minimum number of elements and designed with respect to a clock frequency.

First, a case of N=1 will be described. Although N and M do not necessarily correspond to each other, N=1 and M=1 in the following description. FIG. 3 is a graph showing design conditions of the passive circuit section having the minimum number of elements in the case of N=1. In FIG. 3, a horizontal axis represents an angular frequency $\omega$, and a vertical axis represents a reactance ($\Omega$). In FIG. 3, a solid line represents a reactance $X_1(\omega)$ of the passive circuit section 50A, and an alternate long and short dash line is a reactance curve of the output parasitic capacitance $C_{ds}$ based on the absolute value of the reactance of the output parasitic capacitance $C_{ds}$. Since the reactance $X_1(\omega)$ shown in FIG. 3 is a linear function, the reactance $X_1(w)$ is expressed by a following expression.

[Expression 1]

$$jX_1(\omega) = j\omega L_{510} \tag{1}$$

Figure 4:
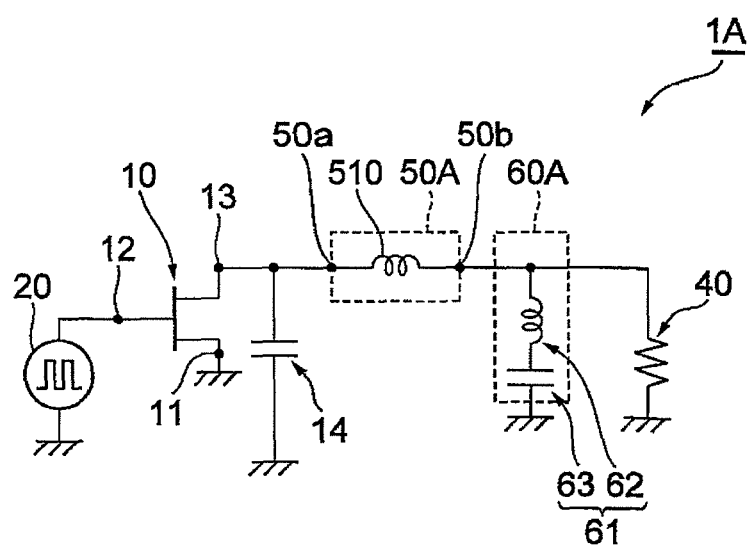
FIG. 4 is a diagram illustrating one example of a configuration of the switching circuit operating at the clock frequency.

The passive circuit section 50A having the reactance curve indicated in the expression (1) may be composed of an inductor 510 as one coil as shown in FIG. 4. FIG. 4 is a diagram illustrating one example of the configuration of the switching circuit in the case of N=1. The load circuit 40 is shown as a resistance. In the expression (1), $L_{510}$ is an element value (an inductance) of the inductor 510. When an angular frequency corresponding to the clock frequency $f_{CK}$ is $\omega_{CK}$, conditions to be satisfied by the inductor 510 as the passive circuit section 50A are as follows.

[Expression 2]

$$X_1(0) = 0 \tag{2a}$$

$$X_1(\omega_{CK}) = \frac{1}{\omega_{CK} C_{ds}} \tag{2b}$$

An expression (3) is obtained from the expressions (2a) and (2b).

[Expression 3]

$$L_{510} = \frac{1}{\omega_{CK}^2 C_{ds}} \tag{3}$$

When the clock frequency $f_{CK}$ is 200 MHz, $\omega_{CK}=2\pi\times200$ MHz. Moreover, when $C_{ds}=60$ pF, $L_{510}=10.54$ nH.

Here, one example of a method for calculating element values of elements constituting the resonant circuit section 60A will be described. In the case of M=1 and N=1, the resonant circuit section 60A may be composed of one inductor 62 and one capacitor 63 as shown in FIG. 4. Resonant conditions of the resonant element $61_1$ are expressed by a next expression.

[Expression 4]

$$j\omega_{CK}L_{62} + \frac{1}{j\omega_{CK}C_{63}} = 0 \tag{4}$$

When a resistance value $R_L$ of the load circuit 40 is 10Ω, $C_{ds}=60$ pF, and $\omega_{CK}=2\pi\times200$ MHz, $L_{62}C_{63}=633.26$ nH·pF from the expression (4). Element values $L_{62}$ and $C_{63}$ of the inductor 62 and the capacitor 63 may be determined so as to satisfy $L_{62}C_{63}=633.26$ nH·pF.

Figure 5:
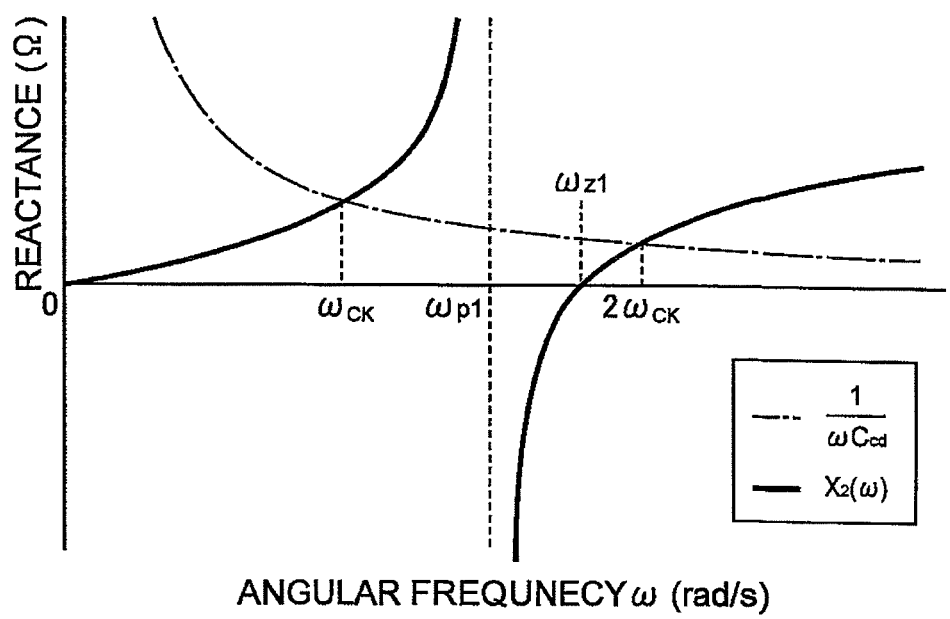
FIG. 5 is a graph showing design conditions of a passive circuit section having the minimum number of elements out of passive circuit sections designed with respect to first-order and second-order harmonics of the clock frequency.

Next, a case of N=2 will be described. Here, the passive circuit section 50A capable of preventing a current having a frequency component up to a second-order harmonic (specifically, a fundamental wave and the second-order harmonic) out of harmonics of consecutive orders from the fundamental wave (the case of N=1) from flowing through the switching element 10 will be described. In this case, while N and M do not necessarily correspond to each other as described above, the resonant circuit section 60A also needs to resonate at a frequency once and twice as high as the clock frequency $f_{CK}$. Thus, N=2 and M=2. FIG. 5 is a graph showing design conditions of the passive circuit section having the minimum number of elements in the case of N=2. In FIG. 5, a horizontal axis, a vertical axis, and an alternate long and short dash line are the same as those in FIG. 3.

A reactance $X_2(\omega)$ shown in FIG. 5 is expressed by an expression (5).

[Expression 5]

$$jX_2(\varpi) = \frac{j\varpi a_2\{(j\varpi)^2 + \varpi_{z1}^2\}}{(j\varpi)^2 + \varpi_{p1}^2} \tag{5}$$

In the expression (5), $\omega_{z1}$ is an angular frequency that satisfies $X_2(\omega)=0$, and a first angular frequency from a direct current ($\omega=0$), $\omega_{p1}$ is an angular frequency of a first pole from the direct current (that is, $\omega=0$), and $a_2$ is a free parameter determined so as to satisfy expressions (6a) to (6c) as the design conditions of the passive circuit section 50A.

[Expression 6]

$$X_2(0) = 0, \tag{6a}$$

$$X_2(\varpi_{CK}) = \frac{1}{\varpi_{CK} C_{ds}}, \tag{6b}$$

$$X_2(2\varpi_{CK}) = \frac{1}{2\varpi_{CK} C_{ds}} \tag{6c}$$

The passive circuit section 50A may be designed as described below in the case of N=2. First, the circuit configuration is determined by executing topology search of the circuit configuration based on the expression (5).

For example, when $j\omega=s$ in the expression (5), the expression (5) is expressed by an expression (7).

[Expression 7]

$$\frac{j\varpi a_2\{(j\varpi)^2 + \varpi_{z1}^2\}}{(j\varpi)^2 + \varpi_{p1}^2} = \frac{s^3 a_2 + s a_2 \varpi_{z1}^2}{s^2 + \varpi_{p1}^2} \tag{7}$$

An expression (8) is obtained by transforming the expression (7).

[Expression 8]

$$\frac{s^3 a_2 + s a_2 \varpi_{z1}^2}{s^2 + \varpi_{p1}^2} = sL_{510} + \frac{1}{sC_{520} + \frac{1}{sL_{511}}} \tag{8}$$

In the expression (8), $L_{510}$, $C_{520}$, and $L_{511}$ are element values of the inductor 510, a capacitor 520, and an inductor 511 of the passive circuit section 50A. The element values $L_{510}$, $C_{520}$, and $L_{511}$ are provided by expressions (9a) to (9c) in the transformation process from the expression (7) to the expression (8).

[Expression 9]

$$L_{510} = a_2, \tag{9a}$$

$$C_{520} = \frac{1}{a_2 \varpi_{z1}^2 - a_2 \varpi_{p1}^2}, \tag{9b}$$

$$L_{511} = \frac{a_2 \varpi_{z1}^2 - a_2 \varpi_{p1}^2}{\varpi_{p1}^2} \tag{9c}$$

The expression (7) can be also transformed into an expression (10).

[Expression 10]

$$\frac{s^3 a_2 + s a_2 \varpi_{z1}^2}{s^2 + \varpi_{p1}^2} = \frac{1}{\frac{1}{sL_{510}} + \frac{1}{sL_{511} + \frac{1}{sC_{520}}}}. \tag{10}$$

In the expression (10), $L_{510}$, $L_{511}$, and $C_{520}$ are provided by expressions (11a) to (11c) in the transformation process from the expression (7) to the expression (10).

[Expression 11]

$$L_{510} = \frac{a_2 \varpi_{z1}^2}{\varpi_{p1}^2}, \quad (11a)$$

$$L_{511} = \frac{a_2}{1 - \frac{\varpi_{p1}^2}{\varpi_{z1}^2}}, \quad (11b)$$

$$C_{520} = \frac{1 - \frac{\varpi_{p1}^2}{\varpi_{z1}^2}}{a_2 \varpi_{z1}^2} \quad (11c)$$

Figure 6:
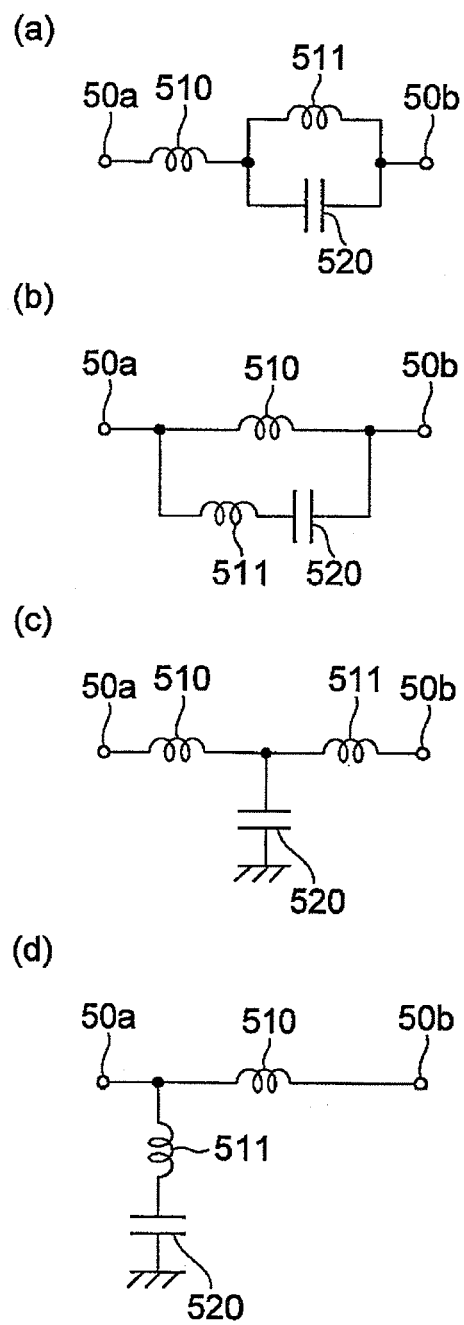
FIG. 6 is a diagram illustrating examples of a circuit configuration of the passive circuit section designed with respect to the first-order and second-order harmonics of the clock frequency.

The expressions (8) and (10) represent circuit configurations shown in FIGS. 6(a) and 6(b). Since the resonant circuit section 60A resonates at the frequency once and twice as high as the clock frequency $f_{CK}$, the second end 50b is shunted (that is, grounded) at the frequency. Therefore, a circuit configuration in FIG. 6(c) is obtained as a modification of FIG. 6(a), and a circuit configuration in FIG. 6(d) is obtained as a modification of FIG. 6(b).

Element values of respective elements in circuits shown in FIGS. 6(a) and 6(b) can be calculated based on the expressions (9a) to (9c) and the expressions (11a) to (11c) by providing $\omega_{z1}$, $\omega_{p1}$ and $a_2$ so as to satisfy the expressions (6a) to (6c). In the case of N=2 and M=2, the resonant circuit section 60 is composed of the two resonant elements $61_1$ and $61_2$ connected in parallel. Element values of the inductor and the capacitor constituting each of the resonant elements $61_1$ and $61_2$ can be calculated in a similar manner to the case of N=1.

Figure 7:
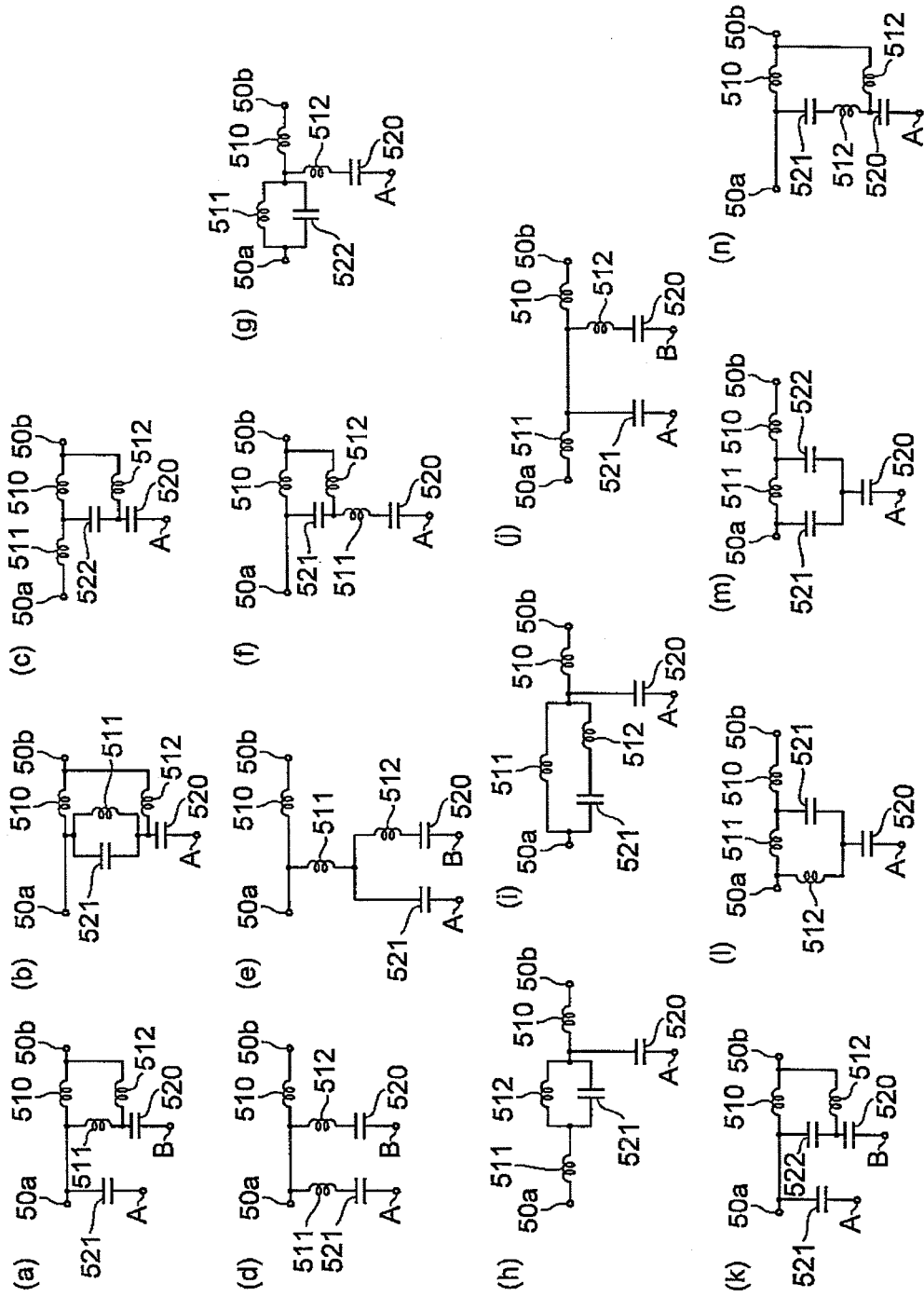
FIG. 7 is a diagram illustrating examples of a circuit configuration of a passive circuit section designed with respect to the first-order harmonic, the second-order harmonic, and a third-order harmonic of the clock frequency.

In a case of N=3, the passive circuit section 50A can be also designed in a similar manner to the case of N=2. Here, the passive circuit section 50A capable of preventing a current having a frequency component up to a third-order harmonic (specifically, the fundamental wave, the second-order harmonic, and the third-order harmonic) out of the harmonics of consecutive orders from the fundamental wave (the case of N=1) from flowing through the switching element 10 will be described. FIGS. 7(a) to 7(n) are diagrams illustrating configuration examples of the passive circuit section 50A in the case of N=3. In the case of N=3, the passive circuit section 50A may be composed of a combination of three inductors 510, 511, and 512 and two capacitors 520 and 521 (see FIGS. 7(a) to 7(k)). In the case of N=3, the passive circuit section 50A may be also composed of a combination of two inductors 510 and 511 and three capacitors 520, 521, and 522 (see FIGS. 7(l), 7(m), and 7(n)). In FIGS. 7(a) to 7(n), reference numerals are assigned for the sake of convenience so as to distinguish the inductors and the capacitors. Element values of the inductors and the capacitors of each circuit are set such that the inductors and the capacitors function as the passive circuit section 50A in the circuit.

In FIGS. 7(a) to 7(n), a terminal A and a terminal B are connected to the second end 50b or grounded. The case of a circuit configuration in FIG. 7(a) will be specifically described as one example. FIGS. 8(a) to 8(d) show configurations in which the terminals A and B in FIG. 7(a) are connected to the second end 50b or grounded.

Figure 8:
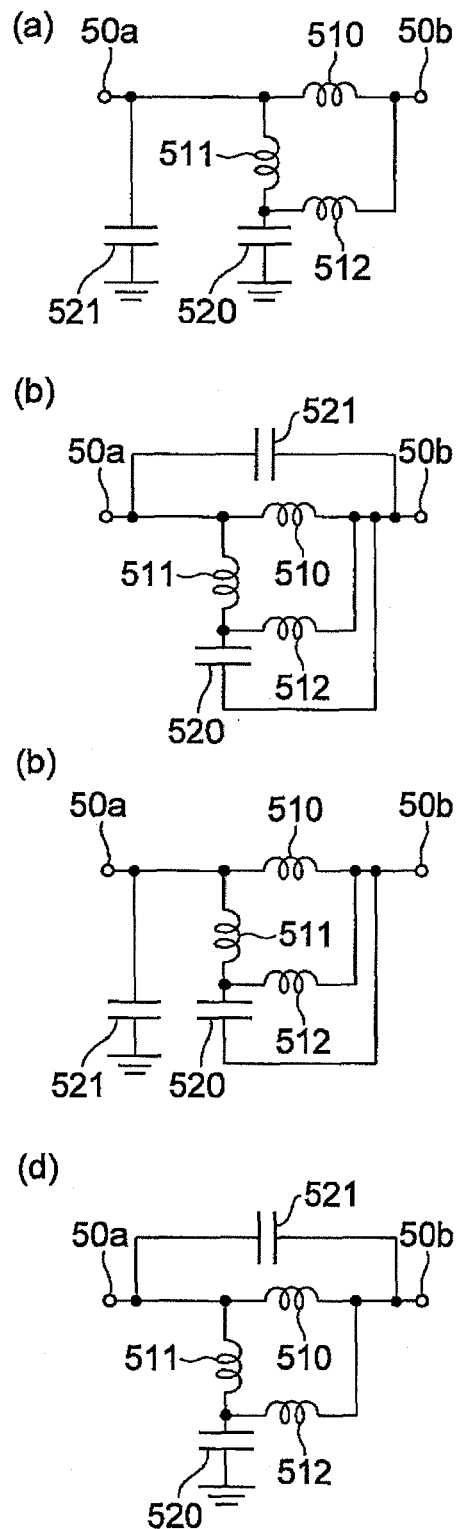
FIG. 8 is a diagram illustrating specific examples of a connection state of terminals A and B in the circuit configuration shown in FIG. 7(a)

FIG. 8(a) shows a configuration in which both terminals A and B are grounded. FIG. 8(b) shows a configuration in which both terminals A and B are connected to the second end. FIG. 8(c) shows a configuration in which the terminal A is grounded and the terminal B is connected to the second end. FIG. 8(d) shows a configuration in which the terminal A is connected to the second end and the terminal B is grounded.

Although the configuration in FIG. 7(a) has been specifically described, the same applies to FIGS. 7(b) to 7(n). Accordingly, in the case of N=3, the passive circuit section 50A may have 38 circuit configurations.

In the case of N=3, the resonant circuit section 60A is composed of the three resonant elements $61_1$ to $61_3$ connected in parallel as M=3. Element values of the inductor and the capacitor constituting each of the resonant elements $61_1$ to $61_3$ can be calculated in a similar manner to the case of N=1.

Here, the configuration of the passive circuit section 50A capable of preventing a current having a frequency component up to the N-th order harmonic (that is, the first-order to N-th order harmonics) with the exemplified N as a maximum order from flowing through the switching element 10 has been mainly described with respect to each of the cases of N=1 to 3. Even when N is 4 or more, the passive circuit section 50A can also similarly prevent the current having the frequency component up to the N-th order harmonic with N as a maximum order from flowing through the switching element 10. When N is 4 or more, element values of the inductor and the capacitor constituting each of the resonant elements $61_4$ to $61_M$ of the resonant circuit section 60A can be also calculated in a similar manner to the cases of N=1, 2, and 3. Please note that N and M do not necessarily correspond to each other as described above.

In the circuit configurations shown in FIGS. 6(a) to 6(d), by adjusting the element values of the inductor elements and the capacitor elements, the passive circuit section 50A capable of preventing a current having a frequency component of not only the harmonics of consecutive orders but of any two harmonics (e.g., the first-order and third-order harmonics) from flowing through the switching element 10 can be obtained. Similarly, in the circuit configurations shown in FIGS. 7(a) to 7(n), by adjusting the element values of the inductor elements and the capacitor elements, the passive circuit section 50A capable of preventing a current having a frequency component of not only the harmonics of consecutive orders but of any three harmonics (e.g., the first-order harmonic, the third-order harmonic, and a fifth-order harmonic) from flowing through the switching element 10 can be obtained.

As described above, when the passive circuit section 50A and the resonant circuit section 60A are composed of the so-called lumped constant elements, higher efficiency can be achieved with smaller physical dimensions with respect to the same frequency as compared to a case in which the passive circuit section uses a distributed constant element when the clock frequency $f_{CK}$ is relatively low (e.g., 100 MHz or less).

(Second Embodiment)

Figure 9:
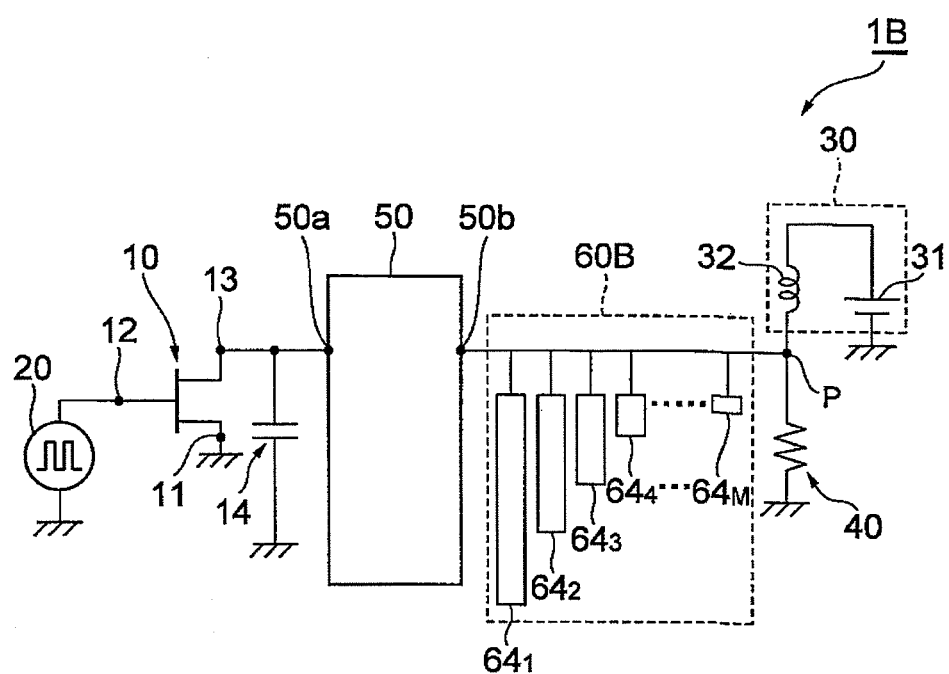
FIG. 9 is a schematic diagram illustrating a schematic configuration of a switching circuit including another example of a resonant circuit section.

FIG. 9 is a schematic diagram illustrating a schematic configuration of a switching circuit including another example of a resonant circuit section. A switching circuit 1B may have the same configuration as that of the switching circuit 1 except for the configuration of a resonant circuit section 60B. Thus, the configuration of the resonant circuit section 60B will be mainly described.

The resonant circuit section 60B has M end-open stubs of first to M-th end-open stubs $64_1$ to $64_M$ whose one end is connected between the output port P and the second end 50b on the signal path. The first to M-th end-open stubs $64_1$ to $64_M$ are so-called distributed constant elements. In other words, the first to M-th end-open stubs $64_1$ to $64_M$ are transmission lines each having a predetermined impedance $Z_S$ and a predetermined electrical length. The electrical length of each of the first to M-th end-open stubs $64_1$ to $64_M$ is determined according to a frequency at which each of the first to M-th end-open stubs $64_1$ to $64_M$ resonates. While the number M of lines may be determined regardless of a clock frequency or a harmonic order, at least one of the first to M-th end-open stubs $64_1$ to $64_M$ has an electrical length of ¼ of a signal wavelength λ with respect to the frequency N times as high as the clock frequency $f_{CK}$. In this case, the electrical length of any end-open stub out of the M end-open stubs may be ¼ of a signal wavelength λ with respect to any harmonic. In the following description, the first to M-th end-open stubs $64_1$ to $64_M$ may be sometimes referred to as end-open stub 64 for the convenience of description.

FIG. 10 is a table showing that there are a plurality of harmonic orders at which one end-open stub can resonate at the same time. For example, the first end-open stub $64_1$ resonating at the fundamental wave (the first-order harmonic) in the case of N=1 also resonates at third-order, fifth-order, seventh-order, . . . , and (2k−1)-th order harmonics at the same time in addition to the first-order harmonic (k is an integer of 1 or more). Similarly, the second end-open stub $64_2$ resonating at the second-order harmonic also resonates at sixth-order, tenth-order, fourteenth-order, . . . , and (2k−1)×2-th order harmonics at the same time. The M-th end-open stub $64_M$ resonating at a $2^{M-1}$-th order harmonic also resonates at $3×2^{M-1}$-th order, $5×2^{M-1}$-th order, $7×2^{M-1}$-th order, . . . , and $(2k−1)×2^{M-1}$-th order harmonics at the same time. The number N of harmonic orders at which the end-open stub 64 resonates is indicated by a "○" mark in FIG. 10. From FIG. 10, when the first to M-th end-open stubs $64_1$ to $64_M$ are provided in parallel, the consecutive number N of harmonic orders at which the end-open stub 64 can resonate is $2^M-1$. FIG. 10 shows a combination in which the end-open stub 64 continuously resonates through N=1 to 15 by using n=1 to 4 as one example. However, the combination of n and N is not limited thereto. "n" in FIG. 10 is an index number of the end-open stub 64 in the total number (M) of end-open stubs 64. The end-open stub 64 does not always need to resonate at harmonics of consecutive orders. For example, when harmonic components of even orders included in a switching voltage waveform are smaller than harmonic components of odd orders, it is effective to allow the end-open stub 64 to resonate at the harmonic components of odd orders. In this case, only one end-open stub $64_1$ is required since the end-open stub 64 needs to resonate only at the harmonic components of odd orders.

The points above will be specifically described. To allow the resonant circuit section 60B to continuously resonate through, for example, N=1, 2, and 3, that is, up to the third-order harmonic, the first end-open stub $64_1$ and the second end-open stub $64_2$ are required. To allow the resonant circuit section 60B to continuously resonate through N=1, 2, 3, 4, 5, and 6, that is, up to the sixth-order harmonic of the clock frequency $f_{CK}$, the first to third end-open stubs $64_1$, $64_2$, and $64_3$ need to be connected in parallel. The harmonics of the plurality of orders N can be covered at the same time by one end-open stub 64 as described above since a standing wave formed in the end-open stub 64 has a periodic shape, and as a result, impedances as viewed from the point P toward the resonant circuit section 60B are the same (0Ω).

Since each of the first to M-th end-open stubs $64_1$ to $64_M$ is the so-called transmission line, the first to M-th end-open stubs $64_1$ to $64_M$ can be formed as a conductive pattern on a printed board. That is, the element can be formed without using separate components such as an inductor element and a capacitor element. Accordingly, when the resonant circuit section 60B is composed of the first to M-th end-open stubs $64_1$ to $64_M$ as described in the second embodiment, the manufacturing efficiency, component cost, reliability and power durability of the switching circuit 1B can be improved. Since each of the first to M-th end-open stubs $64_1$ to $64_M$ can be composed only of the transmission line, i.e., the conductive pattern on the printed board, its element value has high accuracy, so that the switching circuit 1B requires no adjustment after being manufactured.

(Third Embodiment)

In the first embodiment, the passive circuit section 50A (50) is composed of the so-called lumped constant element. However, the passive circuit section 50 may be also composed of a distributed constant element. The case in which the passive circuit section 50 is composed of the distributed constant element will be described. Here, the passive circuit section 50 is referred to as passive circuit section 50B The passive circuit section 50B including a transmission line 530 as the distributed constant element may be designed as described below. First, the case of N=1 will be described. In one embodiment, the transmission line 530 may be a stub.

The passive circuit section 50B is a two-port circuit network. An impedance matrix Z and an inverse matrix (an admittance matrix) Y are known for the two-port circuit network. The impedance matrix and the admittance matrix Y are expressed as in expressions (12a) and (12b) as a function of an angular frequency ω.

[Expression 12]

$$Z = \begin{bmatrix} z_{11}(\varpi) & z_{12}(\varpi) \\ z_{21}(\varpi) & z_{22}(\varpi) \end{bmatrix} \quad (12a)$$

$$Y = Z^{-1} = \begin{bmatrix} y_{11}(\varpi) & y_{12}(\varpi) \\ y_{21}(\varpi) & y_{22}(\varpi) \end{bmatrix} \quad (12b)$$

A current having an angular frequency ω=0, that is, a direct current needs to flow from the end 50a to the end 50b without a voltage drop. To satisfy the condition, when the end 50b is shunted to a ground terminal, the end 50a may be also regarded to be shunted. When expressed in an expression, this is expressed by an expression (13a). Moreover, the direct current should not leak from the end 50a to the ground terminal. To satisfy the condition, when the end 50b is opened, the end 50a may be also regarded to be opened. This is expressed by an expression (13b). Furthermore, a current having an angular frequency ω=$ω_{CK}$, that is, a current having the clock frequency is prevented from flowing from the drain terminal 13 toward the passive circuit section 50B (the right side in FIG. 1). That is, a parallel combined admittance of the end 50a and the output parasitic capacitance $C_{ds}$ may become zero when the end 50b is shunted to the ground. This is expressed by an expression (13c).

[Expression 13]

$$y_{11}(0) = \infty \quad (13a),$$

$$z_{11}(0) = \infty \quad (13b),$$

$$y_{11}(\omega_{CK}) + j\omega_{CK}C_{ds} = 0 \quad (13c)$$

In the expressions (13a) and (13b), a sign ∞ has a meaning that an absolute value of a complex number becomes infinity.

In the case of N=1, the required degree of freedom is 3 as indicated in the expressions (13a) to (13c). However, the expressions (13a) and (13b) are obtained at the same time when the transmission line 530 is one transmission line connected in series. Thus, the minimum required number of transmission lines is 1.

Figure 11:
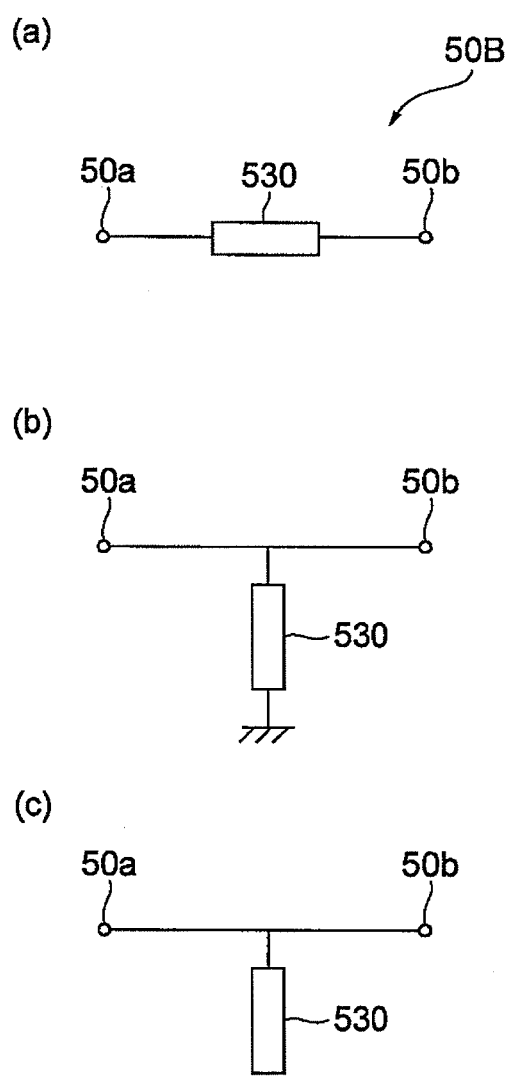
FIG. 11 is a diagram illustrating arrangement options of a transmission line when a passive circuit section is composed of one transmission line.

The total number of topologies of the passive circuit section 50B composed of one transmission line 530 is 3 as shown in FIGS. 11(a) to 11(c). One that satisfies at least one of an incompatibility condition (I) and an incompatibility condition (II) described below is eliminated from the above three topologies.

Incompatibility Condition (I): The end is grounded with respect to the direct current.

Incompatibility Condition (II): An element that directly shunts the second end 50b is provided.

The reason why the circuit satisfying the incompatibility condition (I) is incompatible as the circuit of the passive circuit section 50B is that the circuit satisfying the incompatibility condition (I) contradicts the expression (13b). The reason why the circuit satisfying the incompatibility condition (II) is incompatible as the circuit of the passive circuit section 50B is that the second end 50b corresponds to be grounded at the clock frequency $f_{CK}$, so that the voltage of the clock frequency $f_{CK}$ is not applied to the transmission line 530 in the configuration of the incompatibility condition (II) and there is not enough degree of freedom.

When the inappropriate topology is eliminated by applying the incompatibility condition (I) and the incompatibility condition (II) to the three types of topologies, the passive circuit section 50B composed of the distributed constant element has a configuration shown in FIG. 11(A) in the case of N=1.

By applying such a condition that a combined impedance $Z_{c1}$ of the output parasitic capacitance $C_{ds}$ and the passive circuit section 50B becomes infinity at the clock frequency $f_{CK}$, that is, the expression (13c) to the passive circuit section 50B shown in FIG. 11(a) in a similar manner to the first embodiment, an electrical length of the transmission line 530 is determined. The electrical length of the transmission line 530 can be represented by a phase difference $\theta_{530}$ at the clock frequency $f_{CK}$. Thus, the electrical length is also referred to as electrical length $\theta_{530}$ below.

To be more specific, the expression (13c) as the condition that the combined impedance $Z_{c1}$ of the output parasitic capacitance $C_{ds}$ and the passive circuit section 50B becomes infinity at the clock frequency $f_{CK}$ (or that the combined admittance becomes zero at the clock frequency $f_{CK}$) is expressed by an expression (14).

[Expression 14]

$$j\varpi_{CK}C_{ds} + \frac{1}{jZ_0\tan\theta_{530}} = 0 \tag{14}$$

In the expression (14), $Z_0$ is a characteristic impedance of the transmission line 530. An expression (15) is obtained from the expression (14).

[Expression 15]

$$\theta_{530} = \arctan\left(\frac{1}{Z_0\varpi_{CK}C_{ds}}\right) \tag{15}$$

For example, when $C_{ds}$=60 pF, $\omega_{CK}$=2π×200 MHz, and $Z_0$=50Ω, $\theta_{530}$=0.2593 radians. Thus, when the clock frequency $f_{CK}$ is 200 MHz and the output parasitic capacitance $C_{ds}$ is 60 pF, the transmission line 530 in the case of N=1 may be configured such that the impedance $Z_0$ is 50Ω and the electrical length (the phase difference) is 0.2593 radians.

In the case of N=2, the passive circuit section 50B is designed so as to satisfy the following four conditions by re-using an element of the admittance matrix Y indicated in the expression (12b). Here, the passive circuit section 50B capable of preventing the current having the frequency component up to the second-order harmonic (that is, the fundamental wave (the case of N=1) and the second-order harmonic) out of the harmonics of consecutive orders of the clock frequency $f_{CK}$ from flowing through the switching element 10 will be described as the passive circuit section 50B in the case of N=2.

[Expression 16]

$$y_{11}(0)=\infty \tag{16a}$$

$$z_{11}(0)=\infty \tag{16b}$$

$$y_{11}(\omega_{CK})+j\overline{\omega}_{CK}C_{ds}=0 \tag{16c}$$

$$y_{11}(2\omega_{CK})+j2\overline{\omega}_{CK}C_{ds}=0 \tag{16d}$$

It is the same as the case of the expressions (13 a) and (13c) that $y_{11}(\omega)$ in the expressions (16a), (16c), and (16d) is a first element of the admittance matrix Y.

In the case of the passive circuit section 50B corresponding to up to the second-order harmonic, the required degree of freedom is 4 as indicated in the expressions (16a) to (16d). Thus, the minimum number of transmission lines 530 of the passive circuit section 5013 is 2. When the two transmission lines 530 are separately described, the two transmission lines 530 are referred to as transmission lines 531 and 532.

The total number of topologies of the passive circuit section 50B composed of the two transmission lines (including the case of the stub) is 10 as shown in FIGS. 12(a) to 12(j). By eliminating one that satisfies at least one of the incompatibility conditions (I) and (II) from the 10 topologies, configurations shown in FIGS. 12(a) to 12(c) remain.

By applying the conditions of the expressions (16c) and (16d), that is, the condition that the combined admittance becomes zero at the fundamental wave (N=1) and the second-order harmonic (N=2) at the same time, the characteristic impedance and the electrical length of each of the transmission lines 531 and 532 can be obtained.

Figure 12:
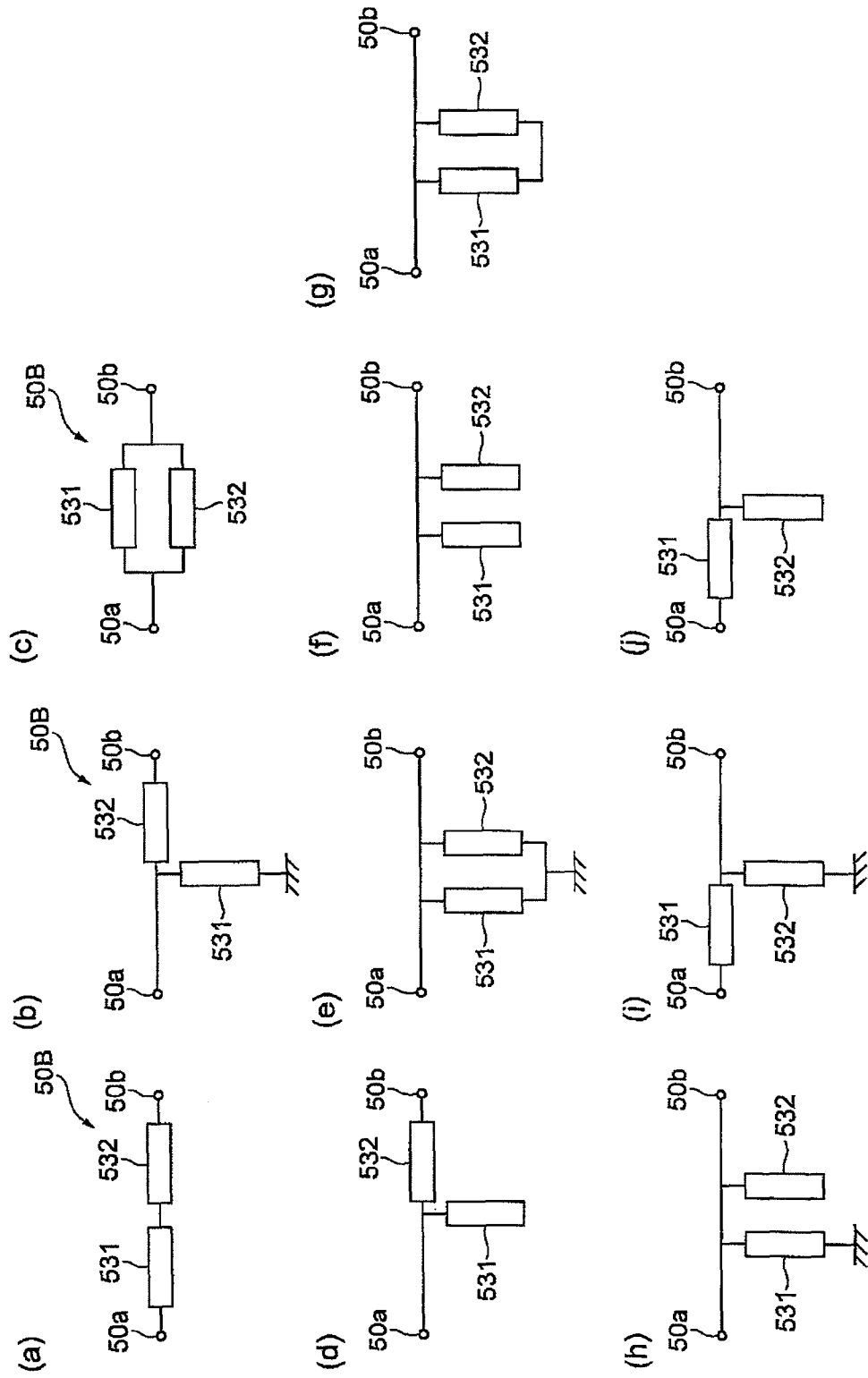
FIG. 12 is a diagram illustrating arrangement options of transmission lines when the passive circuit section is composed of two transmission lines.

The case in FIG. 12(a) will be specifically described. The characteristic impedance of the transmission line 531 is referred to as $Z_{531}$, and the electrical length of the transmission line 531 is referred to as $\theta_{531}$. Similarly, the characteristic impedance of the transmission line 532 is referred to as $Z_{532}$, and the electrical length of the transmission line 532 is referred to as $\theta_{532}$. In this case, a next expression is obtained.

[Expression 17]

$$\varpi_{CK}C_{ds} - \frac{1}{Z_{531}\dfrac{Z_{532}\tan\theta_{532} + Z_{531}\tan\theta_{531}}{Z_{531} - Z_{532}\tan\theta_{532}\tan\theta_{531}}} = 0 \tag{17a}$$

$$2\varpi_{CK}C_{ds} - \frac{1}{Z_{531}\dfrac{Z_{532}\tan 2\theta_{532} + Z_{531}\tan 2\theta_{531}}{Z_{531} - Z_{532}\tan 2\theta_{532}\tan 2\theta_{531}}} = 0 \tag{17b}$$

When $Z_{531}/Z_{532}=\alpha$, a next expression is obtained from the above expressions.

[Expression 18]

$$\frac{\alpha\tan\theta_{531} + \tan\theta_{532}}{\alpha - \tan\theta_{531}\tan\theta_{532}} = 2\frac{\alpha\tan 2\theta_{531} + \tan 2\theta_{532}}{\alpha - \tan 2\theta_{531}\tan 2\theta_{532}} \tag{18}$$

From the expressions (17a), (17b), and (18), $Z_{531}$ and $Z_{532}$ are expressed as below.

[Expression 19]

$$Z_{531} = \frac{1}{\varpi_{CK}C_{ds}} \frac{\alpha - \tan\theta_{531}\tan\theta_{532}}{\alpha\tan\theta_{531} + \tan\theta_{532}} \quad (19a)$$

$$Z_{532} = \frac{1}{\alpha\varpi_{CK}C_{ds}} \frac{\alpha - \tan\theta_{531}\tan\theta_{532}}{\alpha\tan\theta_{531} + \tan\theta_{532}} \quad (19b)$$

Here, the clock frequency $f_{CK}$ is 200 MHz. In this case, $\omega_{CK}=2\pi\times200$ MHz. Also, it is assumed that $C_{ds}=60$ pF. One example of a solution obtained when the expressions (19a) and (19b) are numerically calculated is as follows.

$Z_{531}=60.0347 \, \Omega$ $\theta_{531}=27°$ $Z_{532}=21.4348 \, \Omega$ $\theta_{532}=144°$ Since the characteristic impedances $Z_{531}$ and $Z_{532}$ and the electrical lengths $\theta_{531}$ and $\theta_{532}$ of the respective transmission lines 531 and 532 are obtained as described above, the respective transmission lines 531 and 532 can be configured.

Figure 13:
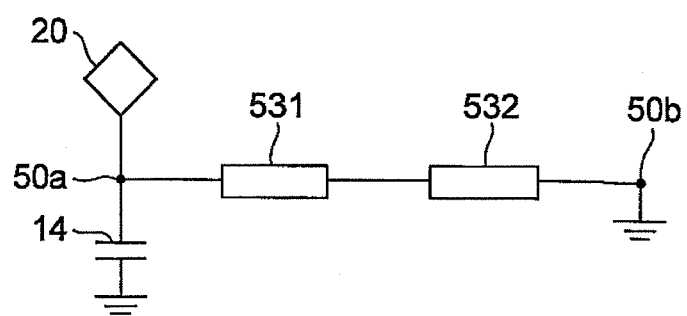
FIG. 13 is a diagram illustrating a circuit for simulations when the passive circuit section is composed of two transmission lines.

A simulation was performed using a circuit configuration shown in FIG. 13 by providing $Z_{531}$, $\theta_{531}$, $Z_{532}$, and $\theta_{532}$ described above. In the circuit configuration shown in FIG. 13, it was assumed that the resonant circuit section 60 resonated at the clock frequency $f_{CK}$ and the frequency twice as high as the clock frequency $f_{CK}$, that is, the second end 50b was shunted (grounded). A signal having a frequency f (MHz) was supplied to the first end 50a from the signal source 20.

Figure 14:
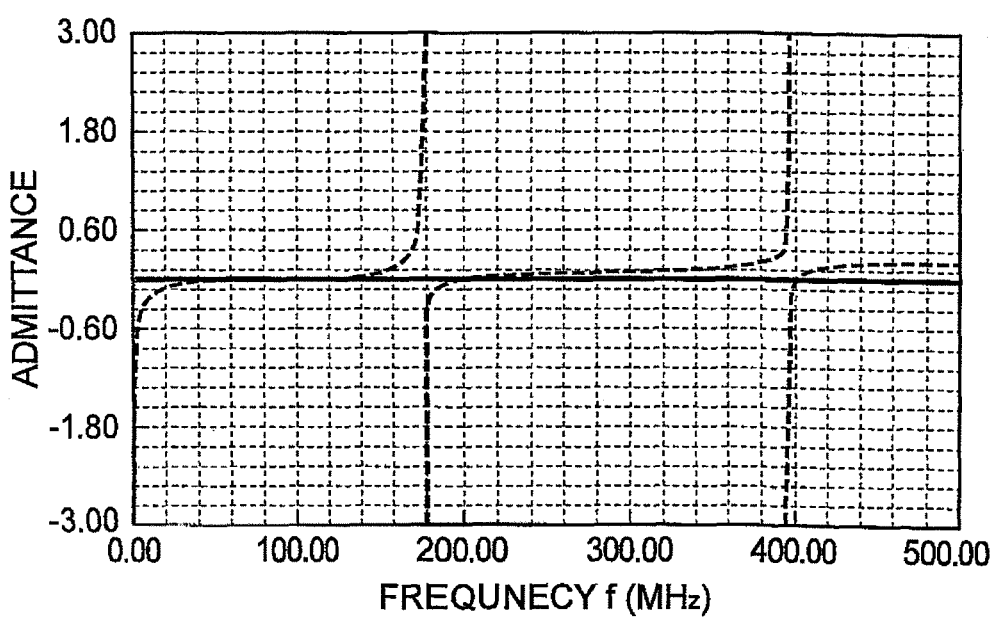
FIG. 14 is a graph showing a simulation result.
Figure 15:
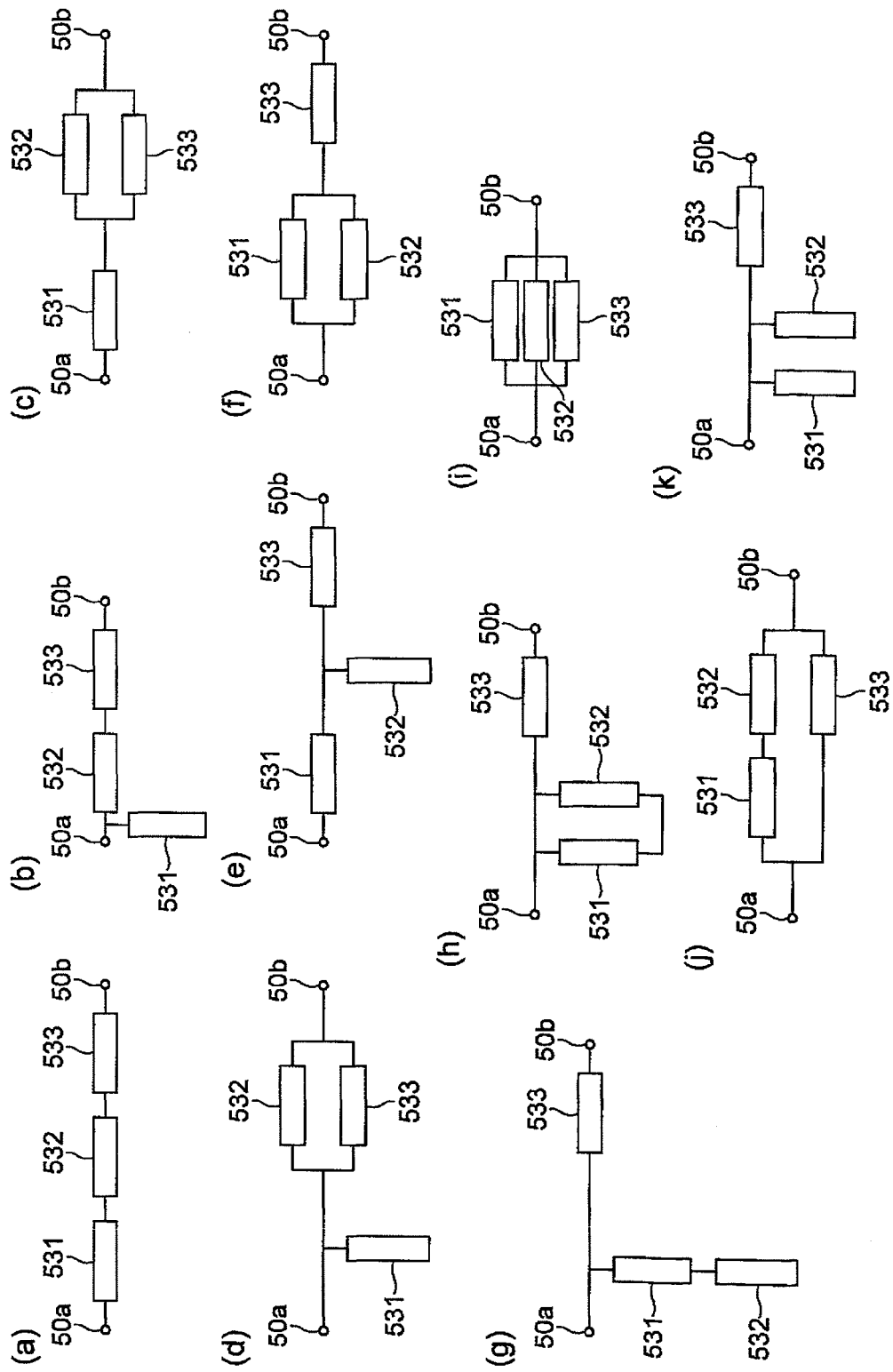
FIG. 15 is a diagram illustrating configuration examples of the passive circuit section composed of three transmission lines.

FIG. 14 is a graph showing a simulation result. In FIG. 14, a horizontal axis represents the frequency $f_{CK}$ supplied to the first end, and a vertical axis represents an admittance. In FIG. 14, a solid line represents a real part of the combined admittance of the passive circuit section 50B and the output parasitic capacitance $C_{ds}$, and a dash line represents an imaginary part of the combined admittance. As shown in FIG. 15, it can be understood that the real part and the imaginary part of the combined admittance become zero when the frequency $f_{CK}$ is 200 MHz, and 400 MHz as the frequency twice as high as 200 MHz, and the expressions (16c) and (16d) are satisfied. It can be also understood that the imaginary part of the combined admittance becomes infinity when the frequency is 0, and the expression (16a) is also satisfied.

In the case of N=3 or more, the passive circuit section 50B may be similarly composed of the distributed constant elements. For example, FIGS. 15(a) to 15(k) are diagrams illustrating configuration examples of the passive circuit section 50B capable of preventing the current having the frequency component up to the third-order harmonic (that is, the fundamental wave (the case of N=1), the second-order harmonic, and the third-order harmonic) out of the harmonics of consecutive orders of the clock frequency $f_{CK}$ from flowing through the switching element 10 as the passive circuit section 50B in the case of N=3. In FIGS. 15(a) to 15(k), three transmission lines 530 are referred to as transmission lines 531, 532, and 533 so as to be distinguished from each other. Conditions (the electrical length or the like) to be satisfied by the respective transmission lines 530 can be determined in a similar manner to the case of N=2.

Since the transmission line 530 is a conductive pattern on a printed board, the element can be easily formed without using separate components such as an inductor and a capacitor. As a result, the manufacturing efficiency, component cost, reliability and power durability of a switching circuit 1C can be improved in a similar manner to the second embodiment. Since the passive circuit section 50B can be formed only by the transmission line, i.e., the conductive pattern on the printed board, the switching circuit 1C requires no adjustment after being manufactured because of the same reason as that in the second embodiment.

Here, the passive circuit section 50B capable of preventing the current having the frequency component up to the N-th order harmonic (that is, the first-order to N-th order harmonics) with N as a maximum order out of the harmonics of consecutive orders of the clock frequency $f_{CK}$ from flowing through the switching element 10 has been described. However, as long as the passive circuit section 50B is designed with respect to the N-th order harmonic, the passive circuit section 50B may be designed so as to prevent a current having a frequency component of harmonics of any one or more orders (e.g., odd or even orders) up to the N-th order harmonic from the fundamental wave (the case of N=1) from flowing through the switching element 10, for example.

In the various embodiments of the passive circuit section 50 described above, the element values of the passive circuit section 50 are determined on the condition that the combined impedance of the passive circuit section 50 and the output parasitic capacitance $C_{ds}$ becomes infinity at the frequency N times as high as the clock frequency $f_{CK}$ (or the combined admittance becomes zero at the frequency N times as high as the clock frequency $f_{CK}$). However, any element value may be employed for the elements of the passive circuit section 50 as long as the passive circuit section 50 satisfies the above "passive circuit section conditions." The same applies to the resonant circuit section 60. That is, in the various embodiments of the resonant circuit section 60, the elements constituting the resonant circuit section 60 are designed such that the real part and the imaginary part of the impedance of the resonant circuit section 60 become zero at the frequency N times as high as the clock frequency $f_{CK}$. However, the real part and the imaginary part of the impedance of the resonant circuit section 60 may not necessarily become zero in actual circuit manufacturing. That is, the element values of the elements constituting the resonant circuit section 60 may be any value as long as the real part and the imaginary part of the impedance of the resonant circuit section 60 are smaller than the impedance of the load circuit 40 in a resonant state.

Moreover, the passive circuit section 50 and the resonant circuit section 60 in the various embodiments described above may be combined together. For example, in addition to the case in which both of the passive circuit section and the resonant circuit section are composed of the lumped constant elements or the distributed constant elements, the switching circuit may include the passive circuit section composed of the lumped constant element and the resonant circuit section composed of the distributed constant element. Conversely, the switching circuit may include the passive circuit section composed of the distributed constant element and the resonant circuit section composed of the lumped constant element.

Although the embodiments of the present invention have been described above, the present invention is not limited to the aforementioned various embodiments, and various modifications may be made therein without departing from the scope of the present invention. For example, the switching element may be a field-effect transistor other than the insulated field-effect transistor, a bipolar transistor, and an insulated gate transistor in addition to the insulated field-effect transistor. Although the signal that drives the switching element is the PWM signal, any pulse signal may be employed as long as the ON/OFF switching of the switching element can be controlled. Moreover, in the second embodiment, the resonant circuit section 60B is composed of the end-open stub 64. However, the resonant circuit section 60B may be composed of the transmission line as the distributed constant element.

What is claimed is:

1. A switching circuit comprising:
a switching element that has a first terminal and a second terminal, and is driven by a pulse signal to switch a conduction state between the first terminal and the second terminal;
a power source section that supplies a voltage to the first terminal of the switching element;
a load circuit that is connected in parallel with the power source section;
a passive circuit section that is connected between a connection point between the power source section and the load circuit, and the first terminal of the switching element, and suppresses a current flowing from the connection point to the switching element at a frequency N times (N is an integer of 1 or more) as high as a clock frequency of the pulse signal; and
a resonant circuit section that is connected between the passive circuit section and the connection point, and resonates at the frequency of N times.

2. The switching circuit according to claim 1,
wherein an imaginary part of an impedance of the passive circuit section anticipated from the switching element is greater than zero, and twice or less of an absolute value of a reactance of an output parasitic capacitance of the switching element.

3. The switching circuit according to claim 1,
wherein a real part and an imaginary part of an impedance of the resonant circuit section anticipated from the load circuit are smaller than an impedance of the load circuit at the clock frequency of N times.

4. The switching circuit according to claim 1,
wherein the pulse signal is a signal obtained by temporally modulating a duty cycle of a pulse width of the pulse signal by a signal having a lower frequency component than the clock frequency.

5. The switching circuit according to claim 1,
wherein the passive circuit section is composed of at least one reactance element, and has a first end connected to the first terminal of the switching element and a second end connected to the connection point.

6. The switching circuit according to claim 1,
wherein the passive circuit section is composed of at least one transmission line, and has a first end connected to the first terminal of the switching element and a second end connected to the connection point.

7. The switching circuit according to claim 1,
wherein the resonant circuit section has M (M is an integer of 1 or more) resonant elements each having at least one reactance element connected in series, and
at least one resonant element out of the M resonant elements resonates at the frequency N times as high as the clock frequency.

8. The switching circuit according to claim 1,
wherein the resonant circuit section has M (M is an integer of 1 or more) transmission lines, and
at least one transmission line out of the M transmission lines has an electrical length of ¼ of a wavelength corresponding to the frequency N times as high as the clock frequency.

* * * * *